United States Patent [19]

Matsuda et al.

[11] Patent Number: 5,014,096
[45] Date of Patent: May 7, 1991

[54] OPTOELECTRONIC INTEGRATED CIRCUIT WITH OPTICAL GATE DEVICE AND PHOTOTRANSISTOR

[75] Inventors: Kenichi Matsuda; Jun Shibata, both of Osaka, Japan

[73] Assignee: Matsushita Electric Industrial Co., Ltd., Japan

[21] Appl. No.: 473,562

[22] Filed: Feb. 1, 1990

[30] Foreign Application Priority Data

Feb. 9, 1989 [JP] Japan .................................. 1-30548

[51] Int. Cl.$^5$ ........................................... H01L 31/12
[52] U.S. Cl. ........................................ 357/19; 357/17; 357/16; 357/30
[58] Field of Search ................... 357/19, 17, 16, 30 G, 357/30 I, 30 D, 30 E

[56] References Cited

U.S. PATENT DOCUMENTS 3,938,173 2/1976 Jackson et al. ......................... 357/19
3,978,343 8/1976 Broderick et al. ................. 357/19 X

FOREIGN PATENT DOCUMENTS 56-7477   1/1981 Japan ..................................... 357/19
60-21577  2/1985 Japan ..................................... 357/19
60-180178 9/1985 Japan ..................................... 357/19
62-26872  2/1987 Japan ..................................... 357/19

OTHER PUBLICATIONS

Spiller, "PN Junctions as Nonlinear Material for Optical Data Processing," *IBM Technical Disclosure Bulletin*, vol. 12, No. 3, Aug. 1969, p. 400.

"Measurement of Gain and Absorption Spectra in AlGaAs Buried Heterostructure Lasers" by C. H. Henry, R. A. Logan, and F. R. Merritt, J. Appl. Phys. 51(6), Jun. 1980, pp. 3042–3050.

"GaInAsP/InP Surface Emitting Injection Lasers with Short Cavity Length" by H. Soda, Y. Motegi, and K. Iga, IEEE Journal of Quantum Electronics, vol. QE-19, No. 6, Jun. 1983, pp. 1035–1041.

*Primary Examiner*—William Mintel
*Attorney, Agent, or Firm*—Lowe, Price, LeBlanc, Becker & Shur

[57] ABSTRACT

An optoelectronic integrated circuit including an optical bistable circuit comprises: an optical gate device responsive to a current injected to an active layer thereof and to a first ray transmitted through the active layer for emitting first and second light rays and for controlling intensity of the first light ray in accordance with the current; and a first phototransistor serially connected with the optical gate device so arranged to receive the second light ray for causing the current to flow through the optical gate device in response to the second light ray and a set signal light ray, the first phototransistor holding flowing of the current when the second light ray is emitted. This circuit can control the first light ray incident to the optical gate device in response to a set signal light ray applied to the first phototransistor. A second phototransistor may be included for stopping emission of light by the optical gate device in response to a reset signal light ray. Such a circuit can be used in an optical neural network as a light-switching device. The first light ray is applied to an optical gate device perpendicularly or horizontally with respect to the plane of the substrate thereof. The second light ray may be emitted by a light-emitting device serially connected with the optical gate.

12 Claims, 8 Drawing Sheets

OPTOELECTRONIC INTEGRATED CIRCUIT WITH OPTICAL GATE DEVICE AND PHOTOTRANSISTOR

BACKGROUND OF THE INVENTION

1. Field of the Invention

This invention relates to an optoelectronic integrated circuit including an optical bistable circuit.

2. Description of the Prior Art

An optical gate device which is capable of controlling loss or gain of light transmitted therethrough in accordance with a current injected thereto is known as a loss modulator or laser amplifier using a semiconductor laser. For example, C.H. Henry et al. in Journal of Applied Physics, vol. 51, page 3042, 1980, describes such a device as follows:

A loss or gain of a transmitted light ray whose wavelength is around lasing wavelength, in an active layer of a semiconductor laser, varies with a magnitude of a current injected thereto. When a current is not injected, the transmitted light ray is subjected to 100-200 $cm^{-1}$ loss. The loss decreases with increase in the magnitude of the injected current. Further injection of the current provides a gain of light. It is the loss modulator to modulate the transmitted light ray in intensity by injection of the current. On the other hand, it is the laser amplifier to amplify the transmitted light ray with a gain.

Generally, an active waveguide of a semiconductor laser is formed in parallel to the plane of its substrate. The loss modulator and laser amplifier also guide a transmitted light ray in the direction papallel to the plane of the substrate generally. However, when such a loss modulator and laser amplifier are applied to a system utilizing parallelism of light beams, which system is capable of large scale parallel processing, it is desired that the light beam be inputted or emitted perpendicularly with respect to the plane of the substrate to improve integration scale of devices and make construction of the system easier. As a semiconductor laser emitting a laser beam perpendicularly with respect to the plane of the substrate, for example, H. Soda et al. described a surface emitting laser at IEEE Journal of Quantum Electronics, QE-19, page, 1035, 1983, which is shown in FIG. 8. The surface emitting laser comprises an InGaAsP active layer 1 sandwiched between p-InP first clad layer 2 and n-InP second clad layer 3' similar to the conventional semiconductor laser. This laser further comprises first and second reflection mirrors 4 and 5 so that a laser beam 6 is emitted perpendicularly with respect to the plane of the substrate.

SUMMARY OF THE INVENTION

Utilizing this surface emitting laser, a loss modulator or laser amplifier is realized, which emits a laser beam or receives a light beam perpendicularly with respect to the plane of the susbtrate.

Such loss modulator or laser amplifier operates as an optical gate device providing variable loss or gain with respect to a light ray transmitted therethrough. The loss or gain is controlled by a current injected thereinto. However, it be desirable that the optical gate is controlled by an optical signal. In other words, more than a 100×100 gate device array is necessary, considering the application of such device to an optical neural network. If this array is controlled by currents injected from an external circuit, each gate device requires electrical interconnection. The primary merit of utilizing parallelism of light beams is the elimination of the necessity of parallel wirings. Such structure requires parallel wirings for control signals, so that the merit of parallelism of light beams is not utilized. From this respect, if each optical gate is controlled by optic signals, all parallel wirings are unnecessary because interconnection for control signals are replaced with optical interconnections. This invention provides an optoelectronic integrated circuit capable of controlling optical gate devices emitting or receiving a light beam either perpendicularly or horizontally with respect to the plane of the substrate.

The present invention has been developed in order to remove the above-described drawback that parallelism is not utilized.

According to the present invention there is provided an optoelectronic integrated circuit including an optical bistable circuit comprising: an optical gate device responsive to a current injected to an active layer thereof and to a first light ray transmitted through the active layer for emitting a second light ray and for controlling intensity of the first light ray in accordance with the current; and a first phototransistor serially connected with the optical gate device so arranged to receive the second light ray for causing the current to flow through the optical gate device in response to the second light ray and a set signal light ray, the first phototransistor holding flowing of the current when the second light ray is emitted. This circuit can control the first light ray incident to the optical gate device in response to a set signal light ray applied to the first phototransistor. A second phototransistor may be used for stopping emission of the second light ray by the optical gate device in response to a reset signal light ray. Such circuit can be used in an optical neural network as a light-switching device. The incident light ray is applied to optical gate device perpendicularly or horizontally with respect to the plane of the substrate thereof. The second light ray may be emitted by a light-emitting device serially connected with the optical gate.

BRIEF DESCRIPTION OF THE DRAWINGS

The object and features of the present invention will become more readily apparent from the following detailed description taken in conjunction with the accompanying drawings in which.

The same or corresponding elements or parts are designated as like references throughout the drawings.

DETAILED DESCRIPTION OF THE INVENTION

Figure 1:
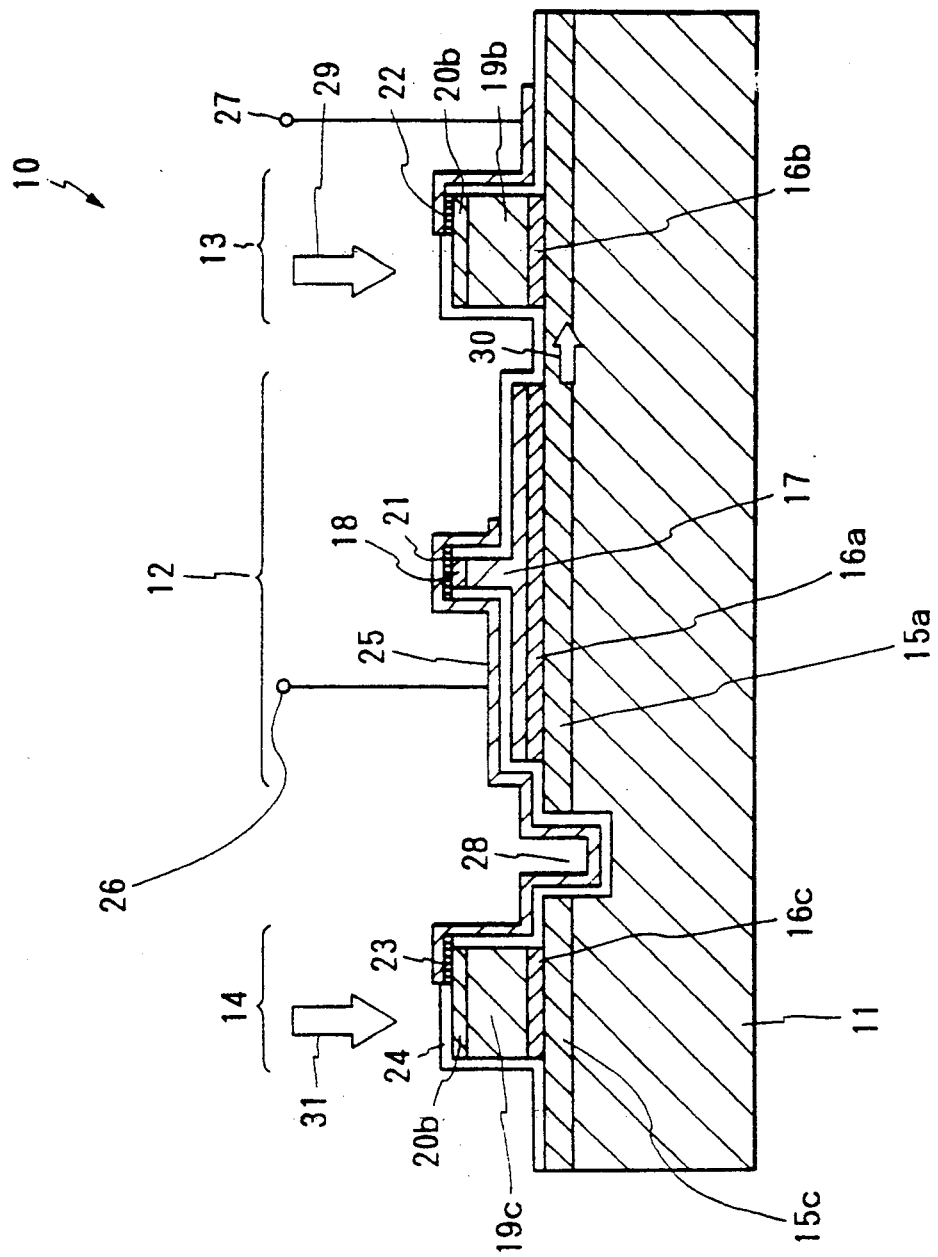
FIG. 1 is a cross-sectional view of a first embodiment of an optoelectronic integrated circuit of the invention.

Referring now to the drawings, FIG. 1 is a cross-sectional view of a first embodiment of an optoelectronic integrated circuit 10 of the invention.

In FIG. 1, an optical gate device 12 and first and second phototransistors 13 and 14 are formed on n-InP semiconductor substrate 11. An optical gate device 12 comprises n-InGaAsP first clad layer 15a (bandgap wavelength $\lambda_g = 1.1$ μm), p-InGaAsP active layer 16a ($\lambda_g = 1.3$ μm), p-InP second clad layer 17, and p-InGaAsP ($\lambda_g = 1.1$ μm) cap layer 18, these layers being accumulated in order of mention. The second clad layer 17 is formed into a rib-type stripe extending in the depth of the drawing. In other words, the active layer 16a acts as a waveguide layer including an active waveguide therein which guides a transmitted light ray (a first light ray) in the direction of depth of the drawing. Loss or gain of the transmitted light ray, i.e., ratio of the incident light thereinto to the output light ray therefrom is varied with an injection current. The optical gate device 12 emits a light ray itself also when a current injected thereinto. This emission light ray (second light ray) is a spontaneous emission which is guided through the active waveguide. A portion of emitted light is also outputted in the transverse direction of the drawing through the first clad layer 15a. The active waveguide is provided for transmitting an incident light ray over a relatively long distance. Thus, if the incident light is applied to the active layer perpendicularly with respect to the substrate 11, the waveguide is unnecessary. In this embodiment, the incident light ray is applied to the active layer horizontally.

The first phototransistor 13 comprises a first clad layer 15a which acts as a collector, an active layer 16b which acts as a base here, an n-InP emitter layer 19b and an n-InGaAsP $\lambda_g = 1.1$ μm) contact layer 20a, these layers being accumulated in order of mention. The second phototransistor 14 has the same structure as the first phototransistor 13. However, the first clad layer 15c is used as an emitter; and its emitter layer 19c is used as a collector. An anode contact 21 is deposited by vacuum evaporation of Au-Zn, etc., on the cap layer 18 of the optical gate device 12. An emitter contact 22 and collector contact 23 are deposited by vacuum evporation of Au-Sn, etc., on the contact layers 20a and 20b of the first and second phototransistors 13 and 14 respectively. A passivation film 24 of SiN covers respective devices except the contact. An interconnection metal 25 is deposited on the passivation film 24 by vacuum evaporation of Ti/Au, etc., for connecting between contacts 21 and 23 and acts as a pad for wire bonding.

Figure 2:
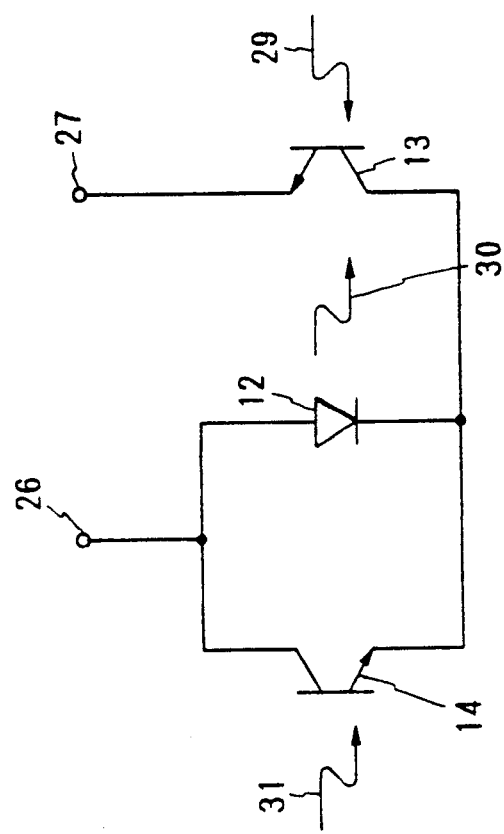
FIG. 2 is an equivalent circuit of a first embodiment.

FIG. 2 is an equivalent circuit diagram of the optoelectronic integrated circuit of FIG. 1. Hereinbelow will be described the reason why the circuit diagram of 2 is equivalent to the function of the optoelectronic integrated circuit of FIG. 1. The cathode of the optical gate device 12, the collector of the first phototransistor 13, and the emitter of the second phototransistor 14 are electrically interconnected with each other through the n-type semiconductor substrate 11. The anode contact 21 is connected with the collector contact 23 of the second phototransistor 14 by the interconnection metal 25 which is connected with an external anode terminal 26. The emitter contact 22 of the first phototransistor 13 is connected with an external cathode terminal 27. A supply voltage is applied between the external anode terminal 26 and the external cathode terminal 26. The optical gate device 12 is optically coupled to a first phototransistor 13 through the first clad layer 15. Thus, the first phototransistor 13 can detect a light ray from the optical gate device 12. On the other hand, the first clad layer 15a of the optical gate device 12 is separated from the first clad layer 15c of the second phototransistor 14 by a groove 28 on which the opaque interconnection metal 25 is formed by vacuum evaporation. Thus, the second phototransistor 14 cannot detect the emission light ray from the optical gate device 12.

Hereinbelow will be described the circuit operation of the first embodiment.

A serially connected circuit comprising the optical gate device 12 and the first phototransistor 13 operates as an optical bistable circuit. In this circuit, when the first phototransistor 13 is in OFF-state, the optical gate device 12 emits no light because the collector current of the first phototransistor 13 does not flow. When a set signal light ray 29' whose wavelength is less than $\lambda_g$ of the active layer 16, is applied to the first phototransistor 13, its collector current flows, so that optical gate device 12 emits a light ray. Once the optical gate device 12 emits the light ray, its holds emission of the light ray because the first phototransistor 13 receives the feedback light ray 30 from the optical gate device 12 so that the collector current of the first phototransistor 13 flows. Thus, the ON-state is held. On the other hand, when a reset signal light ray 31 whose wavelength is less than $\lambda_g$ of the active layer 16a is applied to the second phototransistor 14, this circuit returns to OFF-state because the current does not flow in the optical gate device 12.

This optical gate device 12 can control transmission of a light ray. Hereinbelow will be described control of transmission of a light ray whose wave length is around $\lambda_g$ of the active layer 16 by the optical gate device 12. In OFF-state of the optic bistable circuit, a light beam (which is not shown because this light beam is incident to the active layer 16a perpendicularly in the drawing) transmitted through the active layer 16a of the optical gate device 12 is subjected a large loss because there is no injection current. In ON-state, the loss becomes smaller or the transmitted light beam is outputted at the optical gate device 12 with a gain. In other words, the loss or gain at the optical gate 12 is controllable in that the set signal light ray 29 makes the bistable circuit ON; and the reset signal light ray 31, OFF. In this embodiment, the wavelength of the set and reset signal light rays are determined by $\lambda_g$ of the active layer 16 because these signal light rays 29 and 31 are separated spatially so that there is no problem if these signal light rays 29 and 31 have the same wavelength with each other.

Hereinbelow will be described a second embodiment of the invention with reference to FIG. 3 of perspective view of the second embodiment.

Figure 3:
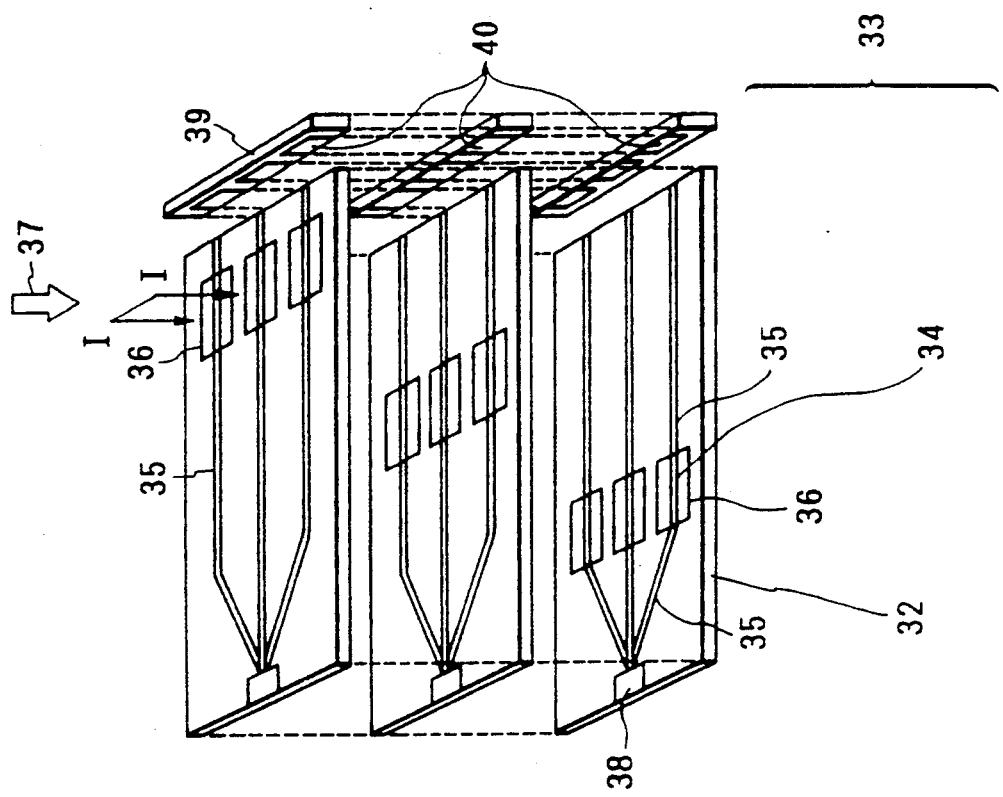
FIG. 3 is a perspective view of a second embodiment of an optoelectronic integrated circuit.

The optoelectronic integrated circuit of this embodiment comprises multilayer structure including plural semiconductor substrates stacked, as shown in FIG. 3 where each layer of the substrates is drawn separately for convenience. Each layer comprises a waveguide array where plural coupled waveguides 33 on a semiconductor substrate are made of semi-insulation InP. The couple waveguide 33 comprises the active waveguide 35 described in the first embodiment and constantly transparent passive waveguide 34 which is optically coupled to the active waveguides 35 at its both ends. The optoelectronic integrated circuit of this embodiment includes the optoelectronic integrated circuit 10 of the first embodiment in an n-type region 36. In other words, a cross-sectional view taken along a line I—I in FIG. 3 of n-type region is essentially shown in FIG. 1. The optic bistable circuit of an optoelectronic integrated circuit 10 included the n-type region 36 controls a transmitted light ray waveguided in the couple waveguide 33 to provide a loss or gain by turning the bistable circuit ON or OFF in response to a signal light ray 37 applied thereto upwardly or downwardly.

All couple waveguides 33 in one layer are converged into a point, at the left portion of the layer in the drawing, where a light-emitting device 38 are formed. At the right portion of the layer in the drawing a photodetector array 39 is arranged prependicularly with respect to the semiconductor substrate 32. Transmitted light ray through couple waveguides 33 are received by photodetectors 40 correspondently arranged respectively.

This optoelectronic integrated circuit of the second embodiment can be used as a circuit for calculating the sum of products for optical neural network, etc. Assuming that a light-emitting device of $i^{th}$ layer from the top layer emits light, a variable $a_i$ is "1"; and that if $j^{th}$ optic bistable circuit from the deepest located bistable circuit in the drawing is in ON state, a variable $T_{ij}$ is "1"; and if OFF-state, "0", the power of the light incident to $j^{th}$ photodetector 40 and output current of the photodetector 40 is proportional to $b_j$ given by:

$$b_J = \sum_i T_{ij} a_i$$

Thus, when a light-emitting device 38 is turned on or off in accordance with values of desired $T_{ij}$ and $a_i$, a result of a sum-of-product operation can be obtained by an output current of the photodetector.

Figure 4:
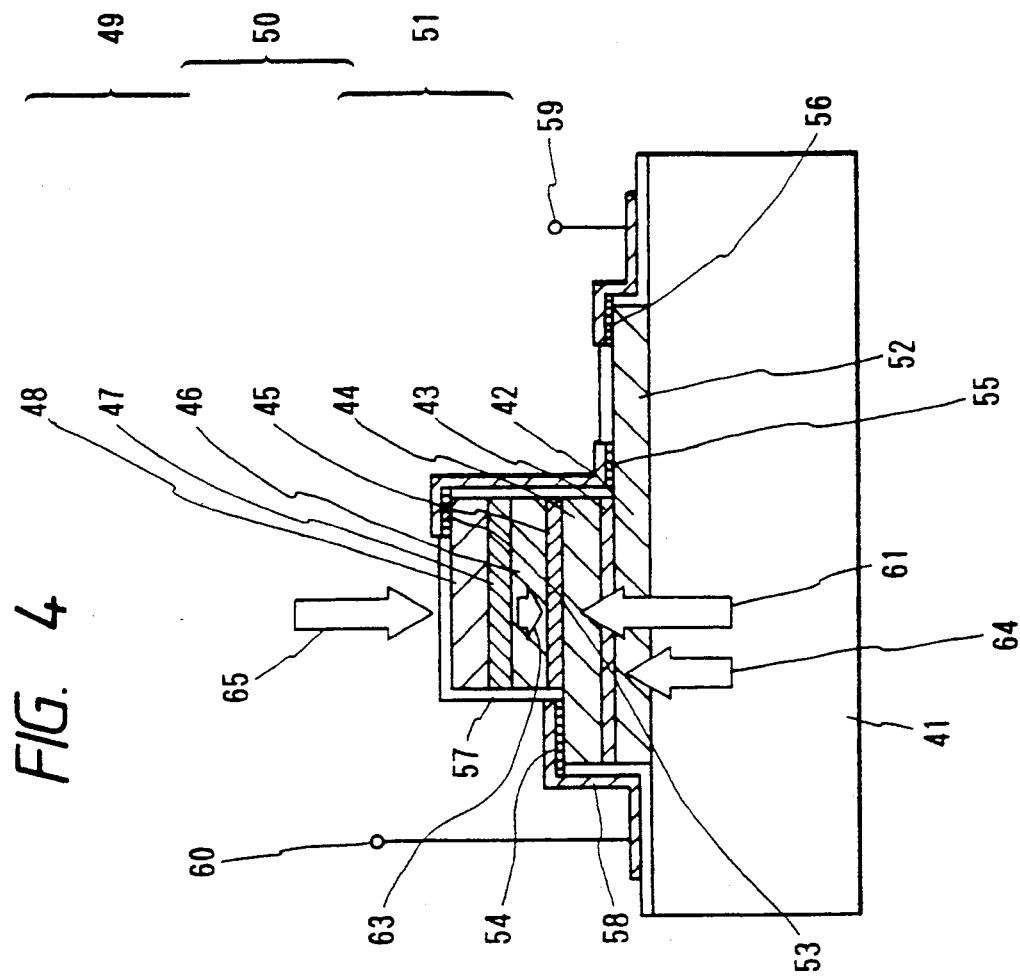
FIG. 4 is a cross-sectional view of a third embodiment of an optoelectronic integrated circuit.

FIG. 4 is a cross-sectional view of a third embodiment of an optoelectronic integrated circuit of the invention. In FIG. 4, on a semiconductor substrate 41 of semi-insulating InP, an n-InP collector layer 42; a first base layer 43 of p-InGaAP ($\lambda_g = 1.1$ μm); an emitter layer 44 of n-InP; a second base layer 45 of p-InGaAsP ($\lambda_g = 1.3$ μm); a first clad layer 46 of n-InP; an active layer 47 of n-InGaAsP ($\lambda_g = 1.3$ μm); and a second clad layer 48 of p-InP are laminated in order of mention. The first clad layer 46, the active layer 47, and the second clad layer 48, function as an optical gate device 49. The emitter layer 44, the second base layer 45, the first clad layer 46, which operates as a collector, function as a first phototransistor 50. The collector layer 42, the first base layer, and the emitter layer 44 form a second phototransistor 51. A portion of the collector layer 42 is used as a load resistor 52. An anode contact 53 is deposited by vacuum evaporation of Au-Zn, etc., on the second clad layer 48. An emitter contact 54 is deposited on the emitter layer 44 by vacuum evaporation of Au-Sn, etc. First and second contacts 55 and 56 are formed on both ends of the load resistor 52 by evaporation of Au-Sn, etc. A passivation film 57 made of SiN covers each layer except contacts, as shown. An interconnection metal 58 made of Ti/Au, etc. is formed on the passivation film 57 by means of evaporation. The interconnection metal 58 interconnects contacts each other and operates as a pad for wire-bonding.

Figure 5:
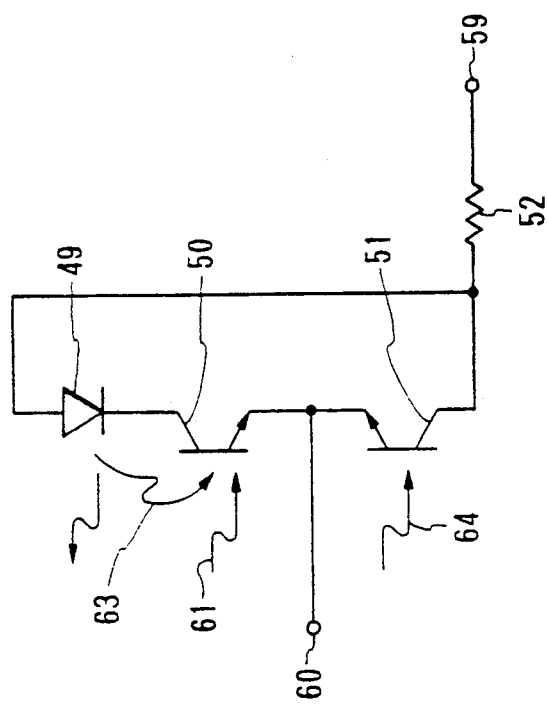
FIG. 5 is an equivalent circuit of a third embodiment.

FIG. 5 is an equivalent circuit diagram of the optoelectronic integrated circuit shown in FIG. 4. In FIG. 4, a cathode of the optical gate device 49 is electrically connected to the collector of the first phototransistor 50. An emitter of the first phototransistor 51 is electrically connected to an emitter of the second phototransistor 51. An anode contact 53 is connected to the first contact 55 by the interconnection metal 58. The second contact 56 of the load resistor 52 is connected to an external anode terminal 59. The emitter contact 54 common to the first and second phototransistors 50 and 51 is connected to an external cathode terminal 60. A supply voltage is externally applied to the external anode terminal 59 and the external cathode terminal 60.

Hereinbelow will be described operation of the embodiment with reference to FIG. 5 of an equivalent circuit diagram of the optoelectronic integrated circuit shown in FIG. 4.

The optical gate device 49 shown in FIG. 4 is electrically connected to the first phototransistor 50 in series, as shown in FIG 5. This series circuit operates as an optic bistable circuit. Thus, the optical gate device 49 emits no light when the first phototransistor 50 is in OFF-state because a current does not flow in the optical gate device 49. When a set signal light ray 61 whose wavelength is less than $\lambda_g$ of the second base layer 45 is applied to the first phototransistor 50, as shown, a collector current of the first phototransistor 50 flows so that the optical gate device 49 emits a feedback light ray (second light ray) 63 whose wavelength is equal to $\lambda_g$ of the second base layer 45 of the active layer 47. Then, although application of the set signal light ray 61 to the first phototransistor 50 stops, this bistable circuit holds ON-state because the first phototransistor 50 receives the light from the optical gate device 49. The emitter layer 44 of the second phototransistor 51 shown in FIG. 4 is connected to the external cathode terminal 60 and the collector layer 42 is connected to the anode of the optical gate device 49 and the load resistor 52, as shown in FIG. 5. In ON-state, when a reset signal light ray 64 whose wavelength is less than $\lambda_g$ of the first base layer 43 is applied to the second phototransistor 51, as shown, the applied voltage to the optic bistable circuit decreases, so that the optic bistable circuit returns to OFF-state.

This optical gate device 49 can control transmission of a light beam (a first light ray) incident thereto perpendicularly or horizontally with respect to the plane of the its substrate by a current injected its active layer. Hereinbelow will be described control of transmission of a light beam whose wavelength is around $\lambda_g$ of the active layer 47 by the optical gate device 49. In OFF-state of the optic bistable circuit, a light beam 65 transmitted through the active layer 47 is subjected to a large loss because there is no injection current. In ON-state, the loss becomes smaller or the transmitted light beam 65 is outputted at the optical gate 49 with a gain downwardly in the drawing. In other words, the loss or gain at the optical gate 49 is controllable in that the set signal light ray 61 makes the bistable circuit ON; and the reset signal light ray 64, OFF. In this embodiment, the wavelength of the set signal light ray 61 is determined by $\lambda_g$ ($\lambda_g = 1.3$ μm) of the active layer 47. On the other hand, the wavelength of the reset signal light ray 64 is determined by $\lambda_g$ ($\lambda_g = 1.1$ μm) of the first base layer. Thus, these set and reset signal light rays 61 and 64 are distinguished from each other by the wavelength. The wavelength of the transmitted light beam 65 is the same as that of the set signal light ray 61. However, these light rays are distinguished from each other in that incident directions of these lights are different from each other.

Figure 6:
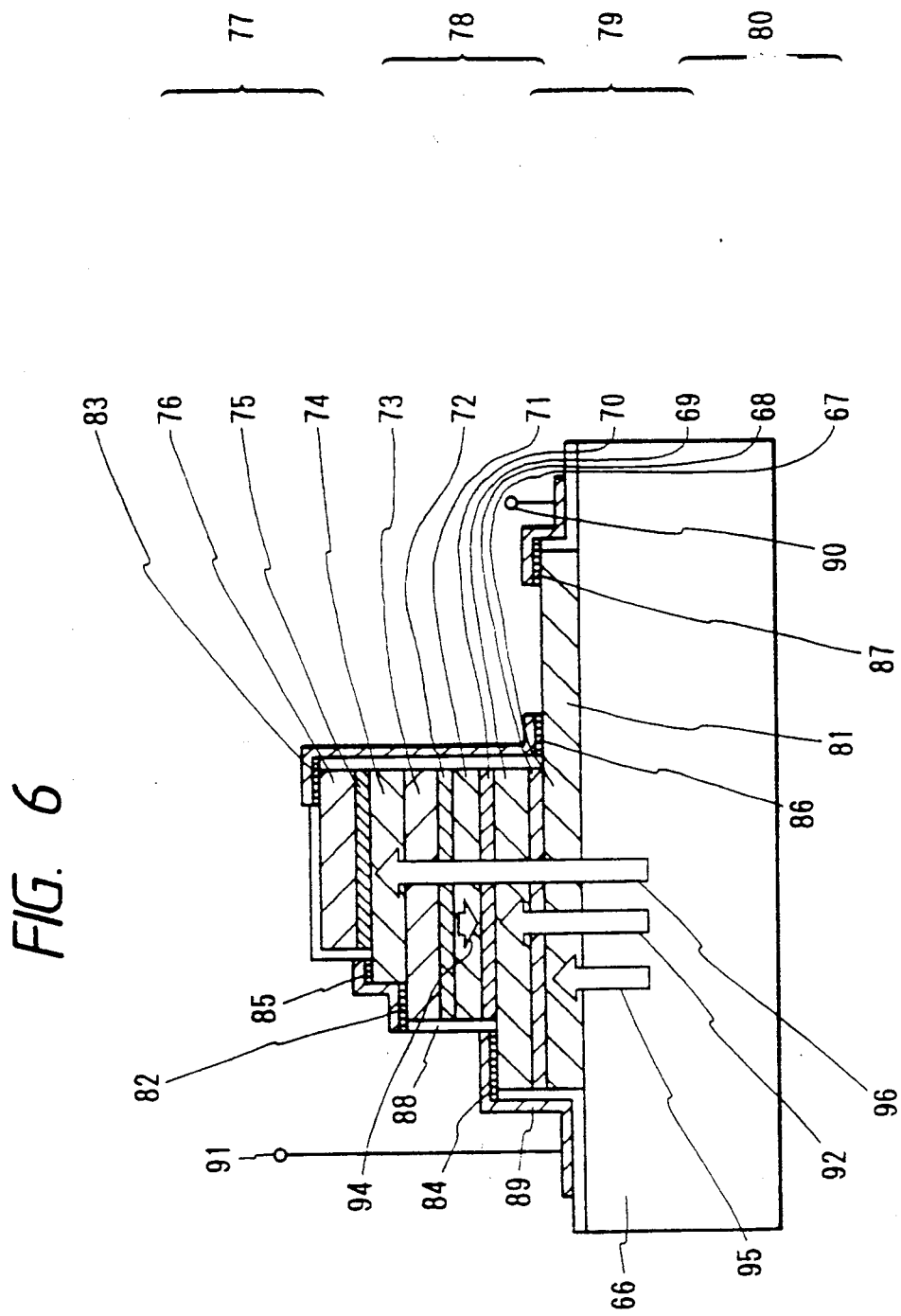
FIG. 6 is a cross-sectional view of a fourth embodiment of an optoelectronic integrated circuit.
Figure 7:
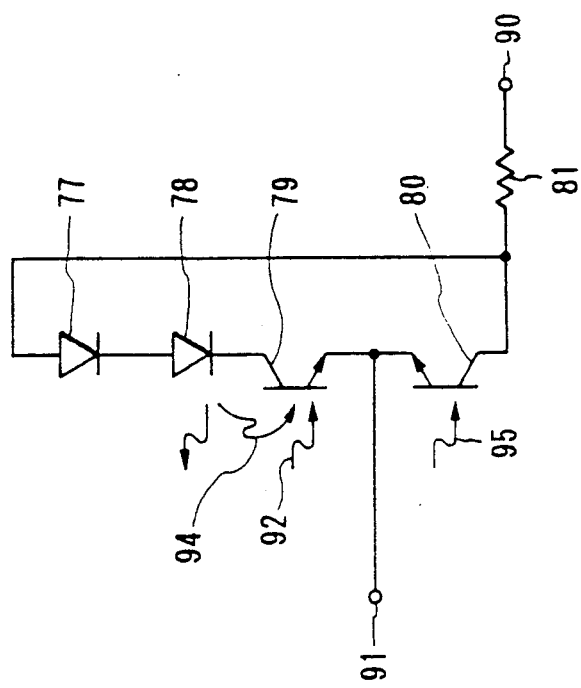
FIG. 7 is an equivalent circuit of a fifth embodiment.
Figure 8:
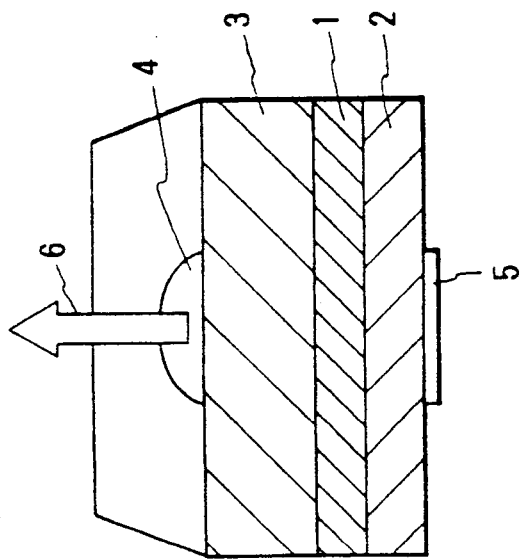
FIG. 8 is a cross-sectional view of a prior art surface emitting laser.

FIG. 6 is a cross-sectional view of a fourth embodiment of an optoelectronic integrated circuit of the invention. In FIG. 6, on a semiconductor substrate 66 of semi-insulating InP, a collector layer 67 of n-InP; a base layer 68 of p-InGaAsP ($\lambda_g = 1.1$ μm); an emitter layer 69 of n-InP; a second base layer 70 of p-InGaAsP ($\lambda g = 1.3$ μm); a first clad layer 71 of n-InGaAsP; a first active layer 72 of p-InP ($\lambda g = 1.1$ μm); a second clad layer 73 of p-InP; a third clad layer 74 of n-InP; a second active layer 75 of n-InGaAsP ($\lambda g = 1.5$ μm); and a fourth clad layer 76 of p-InP are laminated in order of mention. The third clad layer 74, the second active layer 75, and the fourth clad layer 76 form an optical gate device 77. The first clad layer 71, the first active layer 72 and the second clad layer 73 form light-emitting device 78; the emitter layer 69, the second base layer 70, and the first clad layer 71 which operates as a collector here; form a first phototransistor 79; the collector layer 67, the first base layer 68, and the emitter layer 69 form a second phototransistor 80. These elements are electrically connected as shown in FIG. 7 of the equivalent circuit diagram of the optoelectronic integrated circuit of FIG. 6. A portion of the collector layer 67 is used as a load resistor 81. First and second anode contacts 82 and 83 are deposited on the second and fourth clad layers 73 and 76 by vacuum evaporation of Au-Zn, etc., respectively. Emitter contact 84 and cathode contact 85 are deposited on the emitter layer 69 and the third clad layer 74 by vacuum evaporation of Au-Sn. etc. First and second contacts 86 and 87 are deposited on the both ends of the load resistor 81 by vacuum evaporation of Au-Sn, etc. A passivation film 88 of SiN covers each layer except the above-mentioned contacts. An interconnection metal 89 made of Ti/Au, etc., is deposited on the passivation film 88 by means of vacuum evaporation. The interconnection metal 88 connects contacts each other and functions as a pad forming wire-bonding.

FIG. 7 is an equivalent circuit diagram of the optoelectronic integrated circuit of FIG. 6. Hereinbelow will be described the reason why the optoelectronic integrated circuit of FIG. 6 is equivalent to the circuit shown in FIG. 7. The cathode of the light-emitting device 78 is electrically connected with the collector of the first phototransistor 79. The emitter of the first phototransistor 79 is electrically connected with the emitter of the second phototransistor 80. The cathode contact 85 of the optical gat device 77 is connected with the first anode contact 82 of the light-emitting device 78 by the interconnection metal 89. The second anode contact 83 of the optical gate device 77 is connected with the first contact 86 by the interconnection metal 89. The second contact of the load resistor 81 is connected to the external anode terminal 90. Further, the emitter contact 84 of the first and second phototransistors 79 and 80 are connected with the external cathode terminal 91. A supply voltage is externally applied between the external anode terminal 90 and external cathode terminal 91.

Hereinbelow will be described operation of the embodiment.

A serially connected circuit arrangement formed by the light-emitting device 78 and the first phototransistor 79 operates as an optic bistable circuit. Thus, the optical gate device 78 emits no light when the first phototransistor 79 is in OFF-state because a current does not flow in the optical gate device 78. When a set signal light ray 92 whose wavelength is less than $\lambda g$ of the second base layer 70 is applied to the first phototransistor 79, a collector current of the first phototransistor 79 flows so that the light-emitting device 78 emits a feedback light ray (second light ray) 93 whose wavelength is equal to $\lambda g$ of the first active layer 72. Then, although application of the set signal light ray 92 to the first phototransistor 79 stops, this bistable circuit holds ON-state because the first phototransistor 50 receives the feedback light ray 94 from the optical gate device 77. In ON-state, when a reset light signal ray 95 whose wavelength is less than $\lambda g$ of the first base layer 68 of the second phototransistor 80 is applied to the second phototransistor 80, the applied voltage to the optic bistable circuit decreases, so that the optic bistable circuit returns to OFF-state.

This optical gate device 77 can control transmission of a light beam incident thereto perpendicularly or horizontally with respect to the plane of the its substrate by a current injected into its active layer. Hereinbelow will be described control of transmission of a light beam (first light ray) 96 whose wavelength is around $\lambda g$ of the second active layer 75 by the optical gate device 49. In OFF-state of the optic bistable circuit, a light beam 96 transmitted through the active layer 47 is subjected to a large loss because there is no injection current. In ON-state, the loss becomes smaller or the transmitted light beam 96 is emitted at the optical gate 77 with a gain upwardly in the drawing. In other words, the loss or gain at the optical gate 77 is controllable in that the set signal light ray 92 makes the bistable circuit ON; and the reset signal light ray 95, OFF. The transmitted light beam 96 is not absorbed by the layers other than the second active layer 75 because the wavelength of the transmitted light beam 95 is larger than $\lambda g$ of these layers. In other words, the loss or gain at the optical gate 78 is controllable in that the set signal light ray 92 makes the bistable circuit ON; and the reset signal light ray 95, OFF. In this embodiment, the wavelength of the set signal light ray 92 is determined by $\lambda g$ ($\lambda g = 1.3$ μm) of the second base layer. On the other hand, the wavelength of the reset signal light ray 95 is determined by $\lambda g$ ($\lambda g = 1.1$ μm) of the first base layer. The wavelength of the light beam 95 is determined by $\lambda g$ ($\lambda g = 1.5$ μm) of the second active layer 75. Thus, these signal light rays are distinguished from each other by the wavelength.

In the above-mentioned embodiments, the material of the semiconductor is described as InGaAsP/InP system. However, other materials can be used for the semiconductor, such as a AlGaAs/GaAs system, InGaAs-/InAlAs/InP system.

As mentioned above, this invention provides an optoelectronic integrated circuit capable of controlling a signal light ray transmitted through the optical gate device which emits or receives light of either direction parallel to perpendicular to the substrate. The optical gate device array using this optoelectronic integrated circuit eliminates necessity of interconnection for control signals for optic device because inputting and outputting of each optical gate device can be done by signal light rays. Therefore, this invention provide a system utilizing parallelism of light, such as an optoneural network, etc.

What is claimed is:

1. An optoelectronic integrated circuit including an optical bistable circuit comprising:
    (a) an optical gate device responsive to a current injected to an active layer thereof and to a first light ray transmitted through said active layer for emitting a second light ray and for controlling an intensity of said first light ray in accordance with said current; and
    (b) a first phototransistor serially connected with said optical gate device so arranged to receive said second light ray for causing said current to flow through said optical gate device in response to said second light ray and a set signal light ray, said first phototransistor holding flowing of said current when said second light ray is emitted.

2. An optoelectronic integrated circuit as claimed in claim 1, wherein said active layer further comprises an active waveguide for guiding said first light ray.

3. An optoelectronic integrated circuit as claimed in claim 1, wherein said optical gate device is stacked on said first phototransistor such that said first light ray is applied to said optical gate device from a side opposite to said first phototransistor, and said set signal light ray is applied to said first phototransistor from a side opposite to said optical gate device.

4. An optoelectronic integrated circuit as claimed in claim 1, further comprising a second phototransistor for decreasing potential difference between an anode and a cathode of said optical gate device in response to a reset signal light ray applied to a base of said second phototransistor.

5. An optoelectronic integrated circuit as claimed in claim 5, wherein said active layer further comprises an active waveguide for guiding said first light ray.

6. An optoelectronic integrated circuit as claimed in claim 5, wherein said optical gate device is stacked on said first phototransistor such that said first light ray is applied to said optical gate device from a side opposite to said first phototransistor, and said set signal light ray is applied to said first phototransistor from a side opposite to said optical gate device.

7. An optoelectronic integrated circuit comprising:
plural substrates, each having;
(a) a light-emitting device;
(b) plural transparent passive waveguides for receiving and guiding a first light ray from said light-emitting device; and
(c) plural optical integrated circuits for receiving said first light ray from respective transparent passive waveguides, each optical bistable circuit including:
  (1) an optical gate device responsive to a current injected to an active layer thereof and said first light ray transmitted through said transparent passive waveguide incident to said active layer for emitting a second light ray and for controlling an intensity of said first light ray in accordance with said current; and
  (2) a first phototransistor serially connected with said optical gate device and so arranged to receive said second light ray for causing said current to flow through said optical gate device in response to said second light ray and a set signal light ray, said first phototransistor holding flowing of said current when said second light ray is emitted.

8. An optoelectronic integrated circuit as claimed in claim 7, wherein said optical bistable circuit further includes a second phototransistor for decreasing potential difference between an anode and a cathode of said optical gate device in response to a reset signal light ray applied to a base of said second phototransistor.

9. An optoelectronic integrated circuit including an optical bistable circuit comprising:

(a) an optical gate device responsive to a current injected to an active layer thereof and to a first light ray transmitted through said active layer and for controlling an intensity of said first light ray in accordance with said current;
(b) a light-emitting device for emitting a second light ray in response to said current; and
(c) a first phototransistor so arranged to receive said second light ray for causing said current to flow through said optical gate device in response to said second light ray and a set signal light ray, said first phototransistor holding flowing of said current when said second light ray is emitted, said optical gate device, said light-emitting device, and said phototransistor being serially connected with each other.

10. An optoelectronic integrated circuit as claimed in claim 9, further comprising a second phototransistor for decreasing potential difference applied between an anode and a cathode of said optical gate device in response to a reset signal light ray applied to a base of said second phototransistor.

11. An optoelectronic integrated circuit as claimed in claim 10, wherein, assuming that a wavelength of said first light ray which can be controlled by said optical gate devices is $\lambda_T$, a longest wavelength detectable by said second phototransistor is $\lambda_{D1}$, there is a relationship given by:

$$\lambda_T > \lambda_{D1} > \lambda_{D2}.$$

12. An optoelectronic integrated circuit comprising:
plural substrates, each having;
(a) a light-emitting device;
(b) plural transparent passive waveguides for receiving and guiding a first light ray from said light-emitting device; and
(c) plural optical bistable circuits for receiving said first light ray from respective transparent passive waveguides, each optoelectronic integrated circuit including:
  (1) an optical gate device responsive to a current injected to an active layer thereof and to said first light ray transmitted through said transparent passive waveguide incident to said active layer for emitting a second light ray and for controlling intensity of said first light ray in accordance with said current;
  (2) a light-emitting device for emitting a second light ray in response to said current;
  (3) a first phototransistor so arranged to receive said second light ray for causing said current to flow through said optical gate device in response to said second light ray and a set signal light ray, said first phototransistor holding flowing of said current when said second light ray is emitted; and
  (4) a second phototransistor for decreasing potential difference between an anode and a cathode of said optical gate device in response to a reset signal light ray applied to base of said second phototransistor, said optical gate device, said light-emitting device, and said phototransistor being serially connected with each other.

* * * * *